(12) United States Patent
Shirai

(10) Patent No.: US 6,612,028 B1
(45) Date of Patent: Sep. 2, 2003

(54) METHOD FOR MANUFACTURING A BUILT-UP CIRCUIT BOARD

(75) Inventor: Masaharu Shirai, Kusatsu (JP)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 09/699,977

(22) Filed: Oct. 30, 2000

(30) Foreign Application Priority Data

Nov. 2, 1999 (JP) .............................. 11-311951

(51) Int. Cl.⁷ .......................... H05K 3/02; H05K 3/36; B05D 5/12; G03C 5/00
(52) U.S. Cl. .......................... 29/846; 29/830; 29/831; 427/96; 430/315
(58) Field of Search ...................... 29/830, 831, 846, 29/847, DIG. 12; 427/96, 97; 430/315, 316, 317, 318; 225/223

(56) References Cited

U.S. PATENT DOCUMENTS

| | | | | |
|---|---|---|---|---|
| 3,934,335 A | * | 1/1976 | Nelson | 29/847 |
| 4,217,182 A | * | 8/1980 | Cross | 174/250 |
| 4,261,800 A | * | 4/1981 | Beckenbaugh et al. | 205/118 |
| 4,666,735 A | * | 5/1987 | Hoover et al. | 427/510 |
| 4,775,449 A | * | 10/1988 | Dumas et al. | 205/167 |
| 5,438,751 A | * | 8/1995 | Miyazaki et al. | 29/847 |

\* cited by examiner

Primary Examiner—Carl J. Arbes
Assistant Examiner—Thiem Deuli Phan
(74) Attorney, Agent, or Firm—Lawrence R. Fraley

(57) ABSTRACT

Methods are provided for the manufacture of a conductive layer on an insulating layer and for the manufacture of a built-up circuit board, each include an innovative step of irradiating the surface of an insulating (resin) layer with ultraviolet light, so that a conventional swelling process can be eliminated or simplified.

7 Claims, 3 Drawing Sheets

| Substrate | UV irradiation | Swelling process | Gloss (60°) | Copper peeling resistance (g/cm) |
|---|---|---|---|---|
| A | Yes | Yes | 3.1 | 1050 |
| B | Yes | No | 12.0 | 900 |
| C | No | Yes | 59.6 | 350 |
| D | No | No | 100.2 | 0 |

METHOD FOR MANUFACTURING A BUILT-UP CIRCUIT BOARD

TECHNICAL FIELD OF THE INVENTION

The present invention relates to a method for depositing a conductive layer on an insulating layer, and relates more particularly to a method for depositing a conductive layer on an insulating layer for a built-up circuit board.

BACKGROUND OF THE INVENTION

A so-called built-up circuit board is conventionally known as a high-density circuit board wherein an insulating layer and a conductive circuit layer are alternately laminated on a base substrate, on the surface of which a conductive circuit is plated. In the process for manufacturing the built-up circuit board, generally, a conductive (metal) layer is formed on the insulating layer of the base substrate by plating.

When the insulating layer is composed of a resin, generally, a pre-process for roughing the surface of the resin layer before metal plating is performed in order to increase the strength of the adhesion between the resin and the plated metal. Oxidization of the surface of the resin layer is one approach and may be performed using an oxidizing agent such as permanganate or chromic acid. During this process, the oxidization effect etches the surface of the resin layer and tiny raised and recessed portions are formed in it (that is, the surface is roughened). Before this oxidization process is employed, however, a process called surface swelling is performed. During the swelling process, the surface of the resin layer is softened (steeped) by applying to it a processing liquid containing an aqueous organic solvent and a strong alkali, such as calcined soda. Since the surface is softened, greater adhesion is possible by the subsequent oxidization (etching) process.

However, the conventional swelling process is plagued with the following problems:
(a) Since stable performance of the swelling process is not easily predictable, the surface of the resin layer often is not uniformly (evenly) softened. As a result, during the oxidization process the surface of the resin layer is not uniformly oxidized and etched, and the strength of the adhesion acquired by the metal plated layer, which is formed later, is reduced in some areas. To reduce this unstable swelling, frequently the effects (the state of the softened surface) of the swelling process must be examined, and/or the composition of the processing liquid adjusted.
(b) Since the processing liquid that is used contains an aqueous organic solvent and a strong alkali, such as calcined soda, it is normally applied at a temperature of 40 to 100C., to prevent the generation of a solvent steam that can adversely affect the environment.

OBJECTS AND SUMMARY OF THE INVENTION

A primary object of the present invention is the resolution of the above conventional problems.

It is another, more specific object of the present invention to provide an innovative resin softening process to replace the conventional swelling process that more stably and uniformly softens the surface of a resin insulating layer.

It is yet another object of the present invention to provide a more reliable built-up circuit board by increasing the adhesive strength of the bond between a metal plated layer and a resin insulating layer, by more stably and more uniformly softening the surface of the insulating layer.

It is still an additional object of the present invention to prevent the swelling process liquid from adversely affecting the environment, by reducing the amount of the fluid that is required.

According to one embodiment of the present invention, there is provided a method for depositing a conductive layer on an insulating layer comprising the steps of preparing a substrate having an insulating layer, irradiating selected portions of the insulating layer with ultraviolet light, oxidizing the selected portions of the insulating layer that have been irradiated with the ultraviolet light, and depositing the conductive layer on the selected portions of the insulating layer that have been oxidized.

Furthermore, according to another embodiment of the present invention, a method is provided for manufacturing a built-up circuit board and including the steps of preparing a substrate, on the surface of which a conductive circuit is plated, depositing a patterned resin layer on the substrate, irradiating selected portions of the surface of the resin layer with ultraviolet light, performing an oxidizing process on selected portions of the surface of the resin layer that has been irradiated with the ultraviolet light, plating a conductive layer on the resin layer for which the oxidizing process has been performed, and patterning the conductive layer to form an electrical circuit.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from FIG. to FIG.

Figure 1:
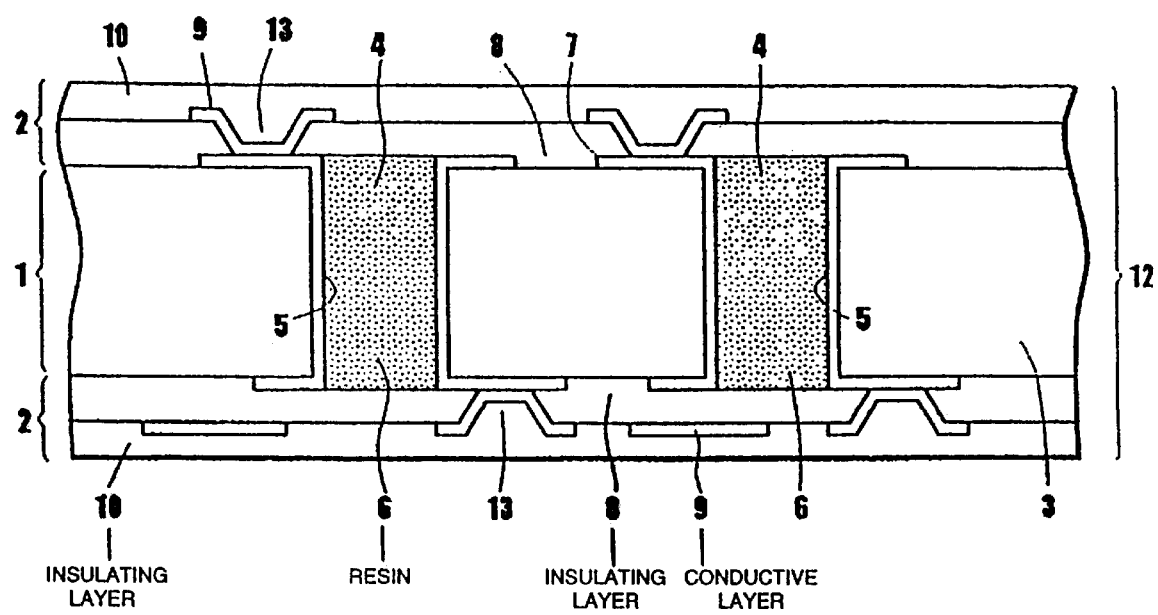
FIG. 1 is a cross-sectional view of a built-up circuit board that is manufactured in accordance with the present invention.

The preferred embodiment of the present invention will now be described. In this embodiment, a method for manufacturing a built-up circuit board is described. The present invention, however, is not limited to this application, and can be applied for other structures than discussed herein wherein plating of an insulating layer with a conductive layer is desired. FIG. 1 is a cross-sectional view of a built-up circuit board 12 that is provided by the present invention. The built-up circuit board 12 is comprised of a base substrate 1 and opposing built-up layers 2, which are formed on both sides of substrate 1. The base substrate includes a base member 3, which is made of an insulating material such as glass epoxy resin. Conductive vias 5 of metal are formed by plating the inner walls of through holes 4, which are formed in the base member 3 and which are later filled with a resin 6, and are then connected to conductive circuits 7 deposited on the surfaces of the base member 3.

Each of the built-up layers 2 comprises two insulating layers, 8 and 10, and a conductive layer 9, and is produced by alternate lamination of the conductive and insulating layers. The present invention, which relates to the formation of the built-up layers 2, relates in particular to the formation of the conductive layers 9 on the insulating layers 8, which layers 8 can be integrally formed at the same time through holes 4 are filled with the resin 6. The process employed to deposit a conductive layer 9 on an insulating layer 8 will now be described in detail.

Figure 2:
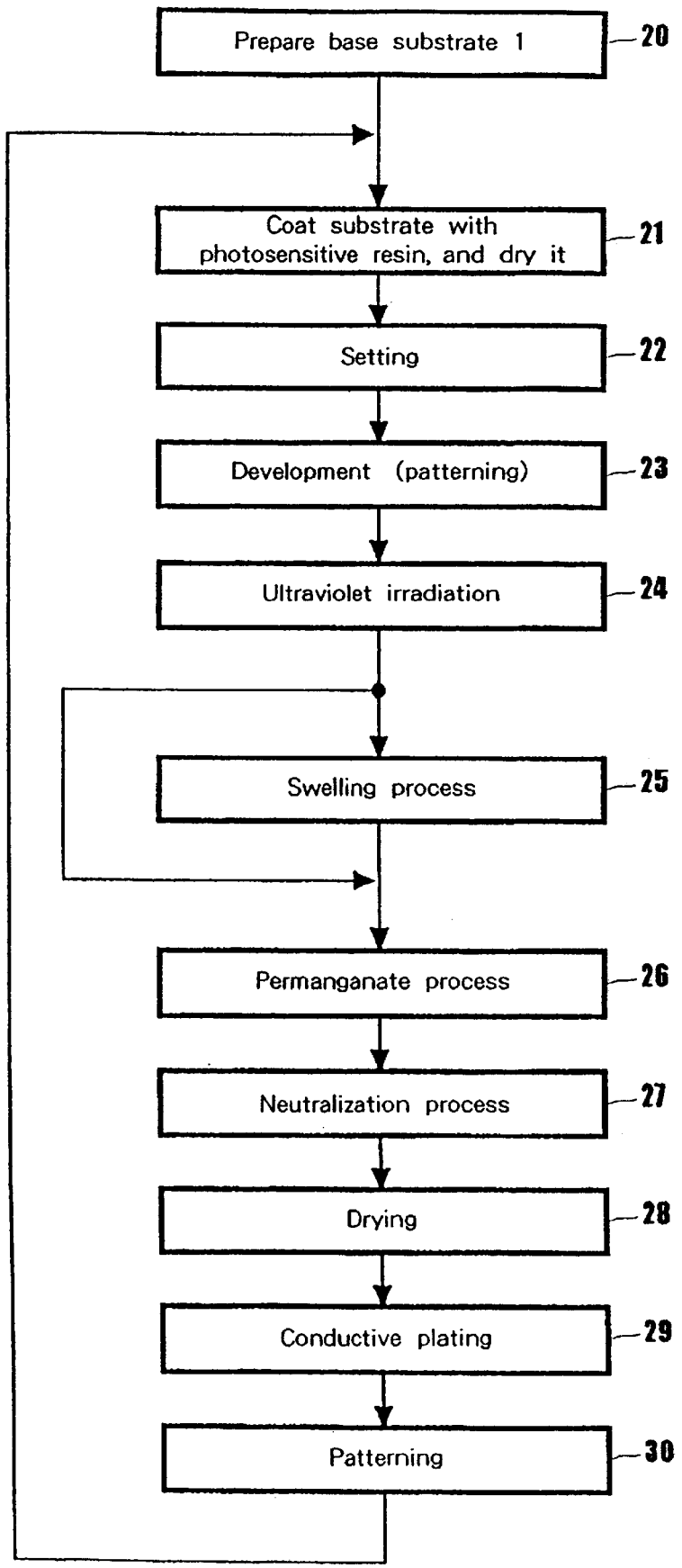
FIG. 2 is a flowchart showing the method according to the present invention for forming a conductive layer on an insulating layer.

FIG. 2 is a flowchart showing the method used to form a conductive layer 9 on an insulating layer 8. First, a conductive circuit 7 is formed on the surface base substrate 1 (step 20). Then, the surface of the base substrate 1 is coated with a photosensitive resin (layer 8) that is thereafter dried (step 21). The dried photosensitive resin is optically set (step 22). A mask, such as a patterned resist film, is employed to develop the obtained resin layer and to form a pattern (step 23). With this pattern, the insulating layer 8 is formed in which holes are provided that are used for the vias 13 in FIG. 1. A thermosetting resin may also be used for the insulating layer 8, but when a thermosetting resin is employed, a laser beam is preferably used to form the vias in layer 8.

Thereafter, the surface of the patterned resin layer is irradiated with ultraviolet light (step 24). The irradiation with ultraviolet light is used to induce the deterioration of the surface of the resin to obtain the same effects (improved softening and wetting properties) as are obtained by a swelling process. It is preferable that the ultraviolet light have sufficient energy to cut the chemical bonds binding the organic materials of which the resin is composed. Generally, ultraviolet light that has a peak wavelength of about 300 nm or shorter is preferable. For example, the "carbon (C)-hydrogen (H)" of which the resin is formed has a chemical bonding energy of approximately 415 (kJ/mol), and a low-pressure mercury lamp emits an ultraviolet light that has a peak wavelength of about 184 nm or 253 nm. Thus, since a wavelength of 253 nm corresponds to an energy output of about 471 (kJ/mol), the ultraviolet light emitted by a low-pressure mercury lamp will suffice. Instead of a mercury lamp, another ultraviolet source, such as an excimer laser, may be employed.

Following this, an optional swelling process may be performed (step 25). As is described above, during the swelling process the surface of the resin is softened (steeped) by using a processing liquid that contains an aqueous organic solvent and a strong alkali, such as calcined soda. Significantly, this swelling process may be eliminated, however, because the same effects can be obtained by the irradiation performed with the ultraviolet light at step 24.

In step 26, an oxidation process is performed for which a permanganate solution is used. During this process, the surface of the resin is removed (etched away) by oxidization, and tiny raised and recessed portions are formed in the resin (the surface is roughened). Thus, the strength is increased of the adhesion of a conductive plated layer that will be formed later. Chromic acid may also be used here. After the oxidation process has been completed, the surface of the resin is neutralized (step 27) and dried (step 28).

Following this, a conductive metal, such as copper (which will form layer 9), is plated on the resin (step 29). Electrolytic plating or electroless plating may be employed. Before such plating is performed, however, a common pre-plating and post-plating process, such as a palladium solvent process, is performed. Then, a patterned resist film is deposited on the conductive member, which is then etched and patterned. In this fashion, the conductive (circuit) layer 9 in FIG. 1 is obtained. Then, program control returns to step 21, in which a second photosensitive resin layer 10 as shown in FIG. 1 is formed. The processing from step 21 to step 30 is repeated in consonance with the number of layers that are to be formed.

The effectiveness of the present invention will be described in more detail while referring to the following example.

EXAMPLE

An FR-4 substrate, which is a known glass epoxy resin substrate, both sides of which have copper foil attached, was prepared, and for the substrate, the following process was performed:

(a) A haloless oxidization process was performed on the FR-4 substrate. During this process, copper oxide, which was produced by the pre-copper plating oxidization process, was removed in advance in order to prevent the insulating layer (composed of resin) from peeling off the copper. Specifically, the reduction process was performed after the copper on the surface of the FR-4 substrate had been oxidized, and as a result, to expose the copper foil several angstroms of copper oxide had to be removed from its surface.

(b) The surface of the FR-4 substrate was coated with about 30 $\mu$m of photosensitive epoxy resin (Probelec 7136) which was then dried.

(c) The FR-4 substrate was exposed to light using an exposure unit that produced a light quantity of 2000 mJ.

(d) The resultant substrate was heated at 110° C. for one hour.

(e) The obtained substrate was again exposed to light using the exposure unit that produced a light quantity of 2000 mJ.

(f) Finally, the substrate was heated at 150° C. for one hour to set the photosensitive epoxy resin.

Test substrates as prepared above were positioned at a distance of 1 cm from a suitable light source (e.g., a Photo-Surface Professor PL16-110 produced by Sen Special Light Source Co., Ltd.), and irradiated with Deep UV light for 10 minutes. A low-pressure mercury lamp (5 mW/cm$^2$ at 254 nm) was employed as the light source, and the substrates that were irradiated were handled in accordance with the processing in FIG. 3. For this test, two substrates (A and B) were prepared, and for substrate A, all of the processing included in steps (a) to (i) in FIG. 3 was performed, while for substrate B, only the processing included in the steps (d) to (i) was performed. As a result, the swelling process was performed for the substrate A, while the swelling process was not performed for the substrate B.

Figures 3, 4:
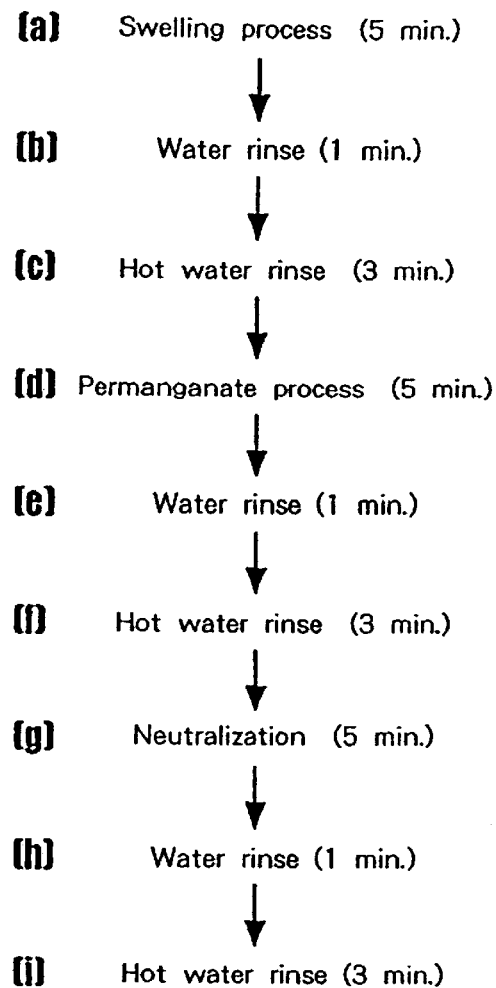
FIG. 3 is a flowchart showing the processing performed to form an insulating layer.
FIG. 4 is a diagram showing the comparison results obtained with example substrates prepared in accordance with the present invention and conventional examples.

Test comparison substrates prepared as in (1) were also processed in consonance with the flowchart in FIG. 3, but, significantly were not irradiated with ultraviolet light. For this test, two substrates, C and D, were prepared, and as in (2), for the substrate A that was prepared in accordance with the embodiment, for substrate C, all of the processing included in the steps (a) to (i) in FIG. 3 was performed, while for substrate D, as was done for substrate B, only the processing included in the steps (d) to (i) was performed. As a result, the swelling process was performed for the substrate C, while the swelling process was not performed for the substrate D.

FIG. 4 is a diagram showing the surface condition for a gloss value of 60° and the copper peeling resistance values obtained for the substrates prepared in accordance with the embodiments, A and B, and the comparison substrates, C and D. The copper peeling resistance value is that evidenced by the copper plating on the surface of the resin. The oxidization degree of copper during the permanganate process in (d) in FIG. 3 can be confirmed by referring to the gloss value in FIG. 4. That is, when the gloss value is increased (the gloss becomes greater), the amount of oxidization acquired during the permanganate process (d) in FIG. 3 is unsatisfactory. And when the gloss value is reduced, the amount of oxidization acquired during the permanganate process (d) in FIG. 3 is satisfactory. This is because in the permanganate process (d) copper is etched, while at the same time darkening of the surface due to oxidization occurs. In other words, the degree of darkening is increased in consonance with an increase in the degree of oxidization. Further, the adhesive strength of copper can be understood by referring to the copper peeling resistance in FIG. 4. That is, as the copper peeling resistance is increased, the adhesive strength of the copper is likewise increased.

As is apparent from FIG. 4, when compared with the comparison substrates C and D that were not irradiated with ultraviolet light, for the substrates A and B of the present invention that were irradiated with ultraviolet light, the gloss value was small, showing that the permanganate process was performed satisfactorily. Further, compared with the substrates C and D, regardless of whether the swelling process was performed, for the substrates A and B the gloss value was small and also shows that the permanganate process was performed satisfactorily. In addition, compared with the substrates C and D, the copper peeling resistance for the substrates A and B was relatively high, as was the adhesive strength of the copper.

For each of the four substrates, a microscopic examination was made of the condition of the surface of the resin after the permanganate process (d) in FIG. 3 had been performed. For the substrates A and B of this invention (which were irradiated with UV), the surface overall was uniformly etched, and raised and recessed portions were formed (the surface was roughened). That is, the effects of the ultraviolet light irradiation on the surface of the resin were uniformly observed.

When comparing the substrate B (for which UV irradiation but no swelling process was performed) in FIG. 4 with the substrate C (for which swelling process was performed, but no UV irradiation), the ultraviolet irradiation in accordance with this invention provides a greater effect than does the conventional swelling process. Therefore, it can be confirmed that the conventional swelling process can be replaced with the ultraviolet irradiation, and that a greater effect can be obtained by performing both the conventional swelling process and the ultraviolet irradiation in accordance with this invention.

Since, as a pre-process for conductive plating, the ultraviolet irradiation process is employed instead of the conventional swelling process, the surface of a resin is roughened (steeped) more than during the aforementioned conventional swelling process. As a result, during the following permanganate process, the oxidization etching of the surface of the resin is more effective than by the conventional method, so that the plating of the conductive layer on the insulating resin layer can be uniformly and stably performed. Especially, the adhesive strength of the conductive layer plated on the insulating resin layer can be increased. This effect can be enhanced even more by performing both the conventional swelling process and the ultraviolet irradiation process of this invention.

Since, as a pre-process for conductive plating, the swelling process, which is a wetting process, using a conventional organic solvent can be replaced with the ultraviolet irradiation process, which is a dry process, the pre-process can be simplified. As a result, the processing speed can be increased. In addition, when both the conventional swelling process and the ultraviolet irradiation process of this invention are employed, the time required for the swelling process can be shortened, or the amount of the organic solvent that is required can be reduced. Therefore, the adverse affect on the environment of an organic solvent can be reduced.

Further, since in accordance with the present invention the plated conductive member can be uniformly and strongly secured to the insulating resin layer, the reliability of a printed circuit board, including a built-up circuit board, is enhanced.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a built-up circuit board, said method comprising:

providing a substrate including at least one hole therein;

providing a conductive circuit on said substrate adjacent said at least one hole;

depositing a first photosensitive resin layer on said substrate to cover said conductive circuit;

forming a pattern within said first photosensitive resin layer to include at least one via therein so as to expose at least part of said conductive circuit;

irradiating selected portions of said first photosensitive resin layer with ultraviolet light;

oxidizing selected portions of said first photosensitive resin layer irradiated by said ultraviolet light;

plating a conductive layer on said selected portions of said first photosensitive resin layer irradiated by said ultraviolet light, including within said at least one via so as to form an electrical connection with said conductive circuit; and patterning said conductive layer to form an electrical circuit to include said electrical connection between said conductive layer and said conductive circuit.

2. The method of claim 1 wherein said first photosensitive resin layer deposited on said substrate to cover said conductive circuit is simultaneously deposited within said at least one hole.

3. The method of claim 1 further including performing a swelling process on said photosensitive resin layer after said irradiating of said photosensitive resin layer and before said performing of said oxidizing process on said selected portions of said photosensitive resin layer.

4. The method of claim 1 wherein said plating of said conductive layer on said selected portions of said photosensitive resin layer is accomplished using electrolytic or electroless plating.

5. The method of claim 4 further including performing a pre-plating process prior to said plating of said conductive layer.

6. The method of claim 1 further including depositing a second photosensitive resin layer over remaining portions of said first photosensitive resin layer.

7. The method of claim 1 wherein the peak wavelength of said ultraviolet light is equal to or less than 300 nm.

* * * * *